(12) United States Patent
Lee et al.

(10) Patent No.: US 12,174,020 B2
(45) Date of Patent: Dec. 24, 2024

(54) SYSTEM AND METHOD FOR HEADING ERROR CORRECTION IN A PULSED RB-87 MAGNETOMETER AT GEOMAGNETIC FIELDS

(71) Applicant: The Trustees of Princeton University, Princeton, NJ (US)

(72) Inventors: Wonjae Lee, Princeton, NJ (US); Michael Romalis, Princeton, NJ (US); Vito Giovanni Lucivero, Barcelona (ES); Mark Limes, Princeton, NJ (US); Elizabeth Foley, Plainsboro, NJ (US); Tom Kornack, Plainsboro, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 428 days.

(21) Appl. No.: 17/333,474

(22) Filed: May 28, 2021

(65) Prior Publication Data

US 2022/0221277 A1 Jul. 14, 2022

Related U.S. Application Data

(60) Provisional application No. 63/031,993, filed on May 29, 2020.

(51) Int. Cl.
*G01R 33/26* (2006.01)
*G01C 17/28* (2006.01)

(52) U.S. Cl.
CPC .............. *G01C 17/28* (2013.01); *G01R 33/26* (2013.01)

(58) Field of Classification Search
CPC ................................. G01C 17/28; G01R 33/26
See application file for complete search history.

(56) References Cited

PUBLICATIONS

Lee, et al., "Heading errors in all-optical alkali-vapor magnetometers in geomagnetic fields", Phys. Rev. A 103, Jun. 4, 2021.
Delsner et al., Sources of heading errors in optically pumped magnetometers operated in the Earth's magnetic field, Physical Review A 99, 013420 (2019).
Ben-Kish et al., "Dead-Zone-Free Atomic Magnetometry with Simultaneous Excitation of Orientation and Alignment Resonances", Phys. Rev. Lett. 105, 193601 (2010).
Seltzer et al., "Synchronous optical pumping of quantum revival beats for atomic magnetometry", Phys. Rev. A 75, 051407(R), 2007.
Acosta, et al., "Production and detection of atomic hexadecapole at Earth's magnetic field", Opt. Express 15, 11423 (2008).
(Continued)

*Primary Examiner* — Jay Patidar
(74) *Attorney, Agent, or Firm* — MEAGHER EMANUEL LAKS GOLDBERG & LIAO, LLP

(57) ABSTRACT

According to various embodiments, a method for reducing heading error in a magnetometer that uses Rb-87 atoms is disclosed. The method includes varying a direction and magnitude of a magnetic field at different spin polarization regimes. According to various embodiments, a magnetometer adapted for reduced heading error is disclosed. The magnetometer includes a multipass cell containing Rb-87 vapor, a pump laser operated in a pulse mode that is synchronous with a Larmor frequency, and two orthogonal probe lasers configured to rotate to vary a direction and magnitude of a magnetic field at different spin polarization regimes.

17 Claims, 15 Drawing Sheets

(56) References Cited

PUBLICATIONS

Acosta, et al., "Nonlinear magneto-optical rotation with frequency-modulation light in the geophysical field range", Phys. Rev. A 73, 053404, 2006.

Pustelny et al., "Punp-probe nonlinear magneto-optical rotation with frequency-modulated light", Phys. Rev. A 73, 023817 (2006).

Yashchuk et al., "Selevtive Addressing of High-Rank Atomic Polarization Moments", Phys. Rev. Lett. 90, 253001 (2003).

Jensen, et al., "Cancellation of nonlinear Zeeman shifts with light shifts", Phys. Rev. A 79, 023406 (2009).

Bao et al., "Suppression of the Nonlinear Zeeman Effect and Heading Error in Earth-Field Alkali-Vapor Magnetometers", Phys. Rve. Ltt. 10, 033202 (2018).

Zhang et al., "Vector measurements using all optical scalar atomic magnetometers", Journal of Applied Physics 129, 044502 (2021).

Yabuzaki et al., "Frequency shifts of self-oscillating magnetometer with cesium vapor", Journal of Applied Physics 45, 1342 (1974).

Chang et al., "Asymetric Heading Errors and its Suppression in Atomic Magnetometers", arXiv:2112.03037, Feb. 5, 2021.

Kitching et al., "Chip-scale atomic devices", Appl. Phys. Rev. 5, 031302 (2018).

SYSTEM AND METHOD FOR HEADING ERROR CORRECTION IN A PULSED RB-87 MAGNETOMETER AT GEOMAGNETIC FIELDS

CROSS-REFERENCE TO RELATED APPLICATIONS

This application claims priority to provisional application 63/031,993, filed May 29, 2020, which is herein incorporated by reference in its entirety.

STATEMENT REGARDING FEDERALLY SPONSORED RESEARCH OR DEVELOPMENT

This invention was made with government support under Grant No. 140D6318C0020 awarded by the Defense Advanced Research Projects Agency (DARPA) and support under Grant No. N0001414C0326 awarded by Office of Naval Research. The government has certain rights in the invention.

FIELD OF THE INVENTION

The present invention relates generally to heading error correction and, more particularly, to a system and method for using a pulsed Rb-87 magnetometer at geomagnetic fields to suppress heading error.

BACKGROUND OF THE INVENTION

Total-field atomic magnetometers measure the magnitude of the magnetic field by directly measuring the Larmor precession frequency of the electron spins of alkali-metal atoms in the presence of the field. They can operate in geomagnetic fields (10-100 μT) and have a wide range of applications, including space magnetometry, fundamental physics experiments, biomedical imaging, archaeological mapping, mineral exploration, searches for unexploded ordnance, and magnetic navigation. The highest sensitivity for scalar magnetometers has been achieved in a pulsed pump-probe arrangement with a sensitivity of 0.54 fT/$\sqrt{Hz}$ in a field of 7.3 μT. However, practical magnetometers need to operate in geomagnetic field around 50 μT.

Recently an all-optical pulsed gradiometer has reached a magnetometer sensitivity of 14 fT/$\sqrt{Hz}$ over a broad range including Earth's field. One major and practical challenge of Earth's field magnetometers is the control of heading errors which otherwise significantly limit their accuracy. They cause the measured field values to depend on the orientation of the sensor with respect to the field, especially presenting problems for the magnetometry-based navigation.

All alkali-metal magnetometers suffer from heading errors because alkali-metal isotopes have nonzero nuclear spin of I>½. There are mainly two physical sources of heading errors: the nonlinear Zeeman splitting due to mixing of ground Zeeman states IF, m) and the difference in Larmor frequencies for the two hyperfine manifolds due to the nuclear magnetic moment. The non-linear splitting corresponds to a difference of 2.6 nT between neighboring Zeeman states for Rb-87 in a 50 μT field. At this field, the linear difference between Zeeman resonance frequencies in F=1 and F=2 states is 200 nT. These splittings of the Zeeman resonance lines produce broadening and asymmetries in the lineshape depending on the orientation of the sensor with respect to the field. For Rb-87 in a 50 μT field, the orientation-dependent shifts are on the order of 15 nT.

Previous approaches of reducing the heading errors in other alkali vapor systems have focused on suppressing the nonlinear Zeeman splitting, including double-modulated synchronous optical pumping, light polarization modulation, measurements of high-order polarization moments, use of tensor light-shift to cancel quadratic Zeeman splitting, and spin-locking with an additional radiofrequency (RF) field. However, they have some practical drawbacks such as complexity in implementation or requiring use of RF fields. These methods also do not cancel frequency shifts associated with the difference of Zeeman resonances for F=1 and F=2 states. In magnetometers operated with continuous optical pumping, the optimal sensitivity is achieved for spin polarization generally near 50%. As a result, there is usually a significant population in F=1 state which changes depending on the orientation of the magnetometer relative to the magnetic field.

As such, there is a need for an approach to reduce heading errors that avoid the above shortcomings.

SUMMARY OF THE INVENTION

According to various embodiments, a method for reducing heading error in a magnetometer that uses Rb-87 atoms is disclosed. The method includes varying a direction and magnitude of a magnetic field at different spin polarization regimes.

According to various embodiments, a magnetometer adapted for reduced heading error is disclosed. The magnetometer includes a multipass cell containing Rb-87 vapor, a pump laser operated in a pulse mode that is synchronous with a Larmor frequency, and two orthogonal probe lasers configured to rotate to vary a direction and magnitude of a magnetic field at different spin polarization regimes.

Various other features and advantages will be made apparent from the following detailed description and the drawings.

BRIEF DESCRIPTION OF THE DRAWINGS

In order for the advantages of the invention to be readily understood, a more particular description of the invention briefly described above will be rendered by reference to specific embodiments that are illustrated in the appended drawings. Understanding that these drawings depict only exemplary embodiments of the invention and are not, therefore, to be considered to be limiting its scope, the invention will be described and explained with additional specificity and detail through the use of the accompanying drawings, in which.

DETAILED DESCRIPTION OF THE INVENTION

Figure 1:
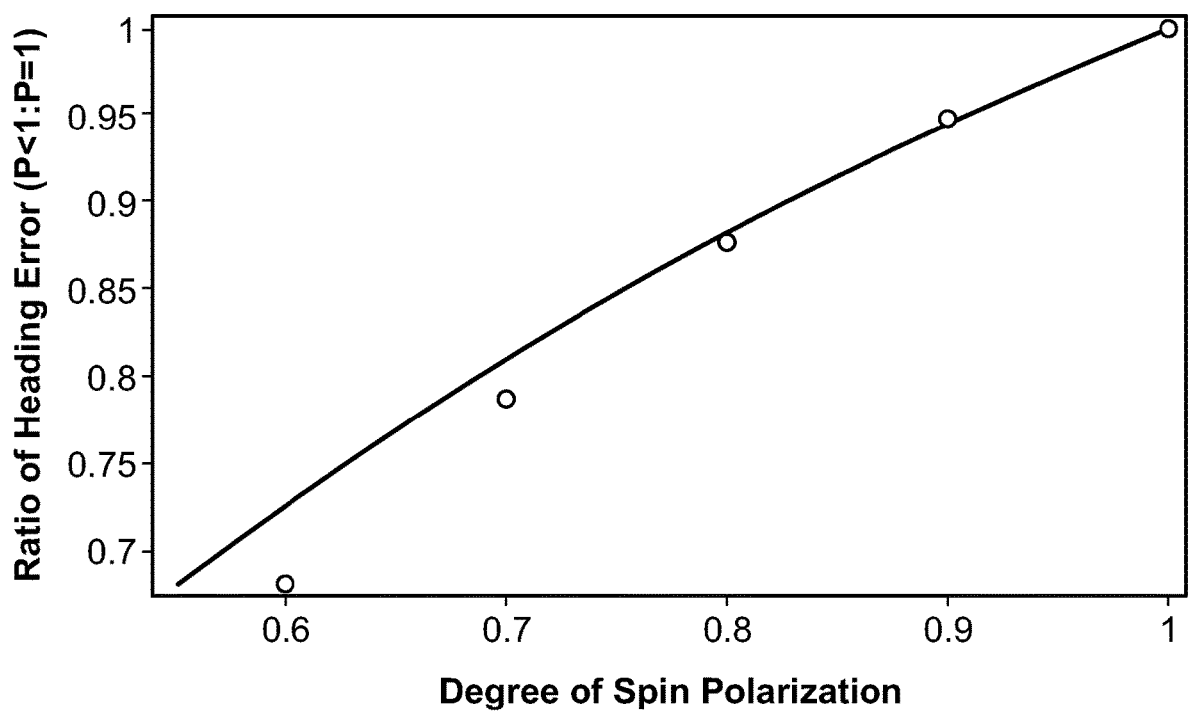
FIG. 1 depicts a graph of ratio of heading error correction at different spin polarization according to an embodiment of the present invention.

Alkali-metal atomic magnetometers suffer from heading errors in geomagnetic fields as the measured magnetic field depends on the orientation of the sensor with respect to the field. In addition to the nonlinear Zeeman splitting, the difference between Zeeman resonances in the two hyperfine ground states can also generate heading errors depending on initial spin polarization.

Generally disclosed herein are embodiments for suppressing heading errors in an all-optical scalar magnetometer that uses free precession of polarized Rb-87 atoms by varying the direction and magnitude of the magnetic field at different spin polarization regimes. In the high polarization limit where the lower hyperfine ground state F=1 is almost depopulated, it is shown that heading errors can be corrected with an analytical expression, reducing the errors by up to two orders of magnitude in Earth's field. The linearity of the measured Zeeman precession frequency is also verified with the magnetic field. With lower spin polarization, it is found that the splitting of the Zeeman resonances for the two hyperfine states causes beating in the precession signals and nonlinearity of the measured precession frequency with the magnetic field. The frequency shifts are corrected by using the unique probe geometry where two orthogonal probe beams measure opposite relative phases between the two hyperfine states during the spin precession.

Generally disclosed herein are embodiments for correcting heading errors as a function of both the direction and magnitude of magnetic field at a wide range of initial spin polarization. With the all-optical, free-precession Rb-87 magnetometer, a short-pulse pumping technique is used to achieve very high initial spin polarization near 95% regardless of the field orientation such that the initial spin state is well-defined. The population of F=1 state becomes negligible, and Zeeman coherences decay much faster in F=1 state than in F=2 state due to spin-exchange collisions between alkali-metal atoms. In this high polarization limit, the polarization-dependent heading errors can be minimized. It is also determined that the average Larmor frequency is given by an analytical expression that depends on the angle between the pump laser and the magnetic field. It is shown this angle can be determined directly from the spin precession signals. Thus, a correction for the heading error can be calculated in real time (e.g., by one or more processing units). After heading errors are corrected, it is found that the accuracy of the magnetometer is on the order of 0.1 nT as a function of both the direction and the magnitude of the magnetic field for fields up to 50 µT.

At lower spin polarization, interesting effects are observed due to non-negligible contribution from the F=1 state. The difference in Zeeman frequencies of F=1 and F=2 states generate beating which is observable in the measurement of spin precession signals. Moreover, the measured spin precession frequency is no longer linear with the magnetic field, even though the splitting itself is linear with the field. Here two probe beams are used to further correct for these heading errors: one is collinear to the pump beam, and the other is perpendicular to the pump. These orthogonal probe beams measure opposite relative phases of the two hyperfine ground states during their precession, allowing one to cancel any effects from the splitting in their Larmor frequency by averaging the two probe measurements. This is because Zeeman coherences precess around the magnetic field in opposite directions for F=1 and F=2 states. As a result, the additional frequency shifts are canceled by averaging the measurements of the two orthogonal probes. Furthermore, experimental results are compared with a density matrix simulation to easily separate signals from F=1 and F=2 states and investigate frequency shifts due to the nuclear magnetic moment.

Analytical Correction of Heading Errors

For Rb-87 atoms in ground states with electronic spin S=½, the energy of the Zeeman sublevel |m⟩ with total atomic angular momentum F is given by the Breit-Rabi formula:

$$E = -\frac{\hbar\omega_{hf}}{2(2I+1)} - g_I\mu_B B_m \pm \frac{\hbar\omega_{hf}}{2}\sqrt{x^2 + \frac{4mx}{2I+1} + 1} \quad (1)$$

where $x=(g_s+g_I)\mu_B B/\hbar\omega_{hf}$, $g_s$ and $g_I=\mu_I/(\mu_B I)$ are the electronic and nuclear Landé factors, respectively, $\mu_B$ is the Bohr Magneton, B is the magnetic field strength, $\omega_{hf}$ is the hyperfine splitting, I is the nuclear spin, and the ± refers to the F=I±½ hyperfine components. In the Earth-field range, the m→m−1 Zeeman transition frequency is given by:

$$\omega_{F,m} \simeq \frac{(\pm\mu_{eff} - g_I\mu_B)B}{\hbar} \mp \frac{\mu_{eff}^2 B^2}{\hbar^2\omega_{hf}}(2m-1) = \omega_L \mp \omega_{rev}(2m-1) \quad (2)$$

where $\mu_{eff}=(g_s\mu_B+g_I\mu_B)/(2I+1)$, $\omega_L=(\pm\mu_{eff}-g_I\mu_B)B/\hbar$ is the Larmor frequency, and $\omega_{rev}=\mu_{eff}^2 B^2/\hbar^2\omega_{hf}$ is the quantumbeat revival frequency which is nonlinear to the field magnitude. The Larmor frequencies for the two hyperfine states are approximately opposite, but not exactly equal because of the $g_I\mu_B$ term. The difference of absolute frequencies is proportional to the magnetic field and equal to 1.4 kHz at 50 µT, where the Larmor frequency is equal to 350 kHz for Rb-87 atoms. The nonlinear Zeeman effect in Earth's field causes a splitting of 18 Hz between neighboring Zeeman transitions, which is non-negligible for magnetometer operation.

The measured transverse spin component can be written in terms of the Rb-87 ground state density matrix as a weighted sum of coherences oscillating at different Zeeman frequencies, given by:

$$\langle S_x \rangle = Tr[\rho S_x] = \Sigma_{F\ m'=m\pm1} A_{F\ m,m'} \rho_{F\ m,m'} \quad (3)$$

where $\rho F\ m, m'$ is the off-diagonal element of density matrix for an ensemble of Rb-87 atoms in coupled basis $|F\ m\rangle$, and $A_{F\ m,m'}$ is its amplitude. The measured spin precession frequency is therefore a combination of different Zeeman transition frequencies. Any variation in sensor's orientation with respect to the field can change the relative strength between the coherences, shifting the measured precession frequency.

In the high spin polarization limit, the modification of the measured field due to heading errors is:

$$B = \frac{4h\nu}{(g_s - 3g_I)\mu_B}\left[1 - \frac{3\nu}{\nu_{hf}}\sin\theta\frac{P(7+P^2)}{5+3P^2}\right] \quad (4)$$

where $\nu = \omega/2\pi$ is the measured precession frequency, $\nu_{hf}$ is the hyperfine splitting frequency, P is degree of initial spin polarization, and $\theta$ is the angular deviation of the pump beam from the nominal magnetometer orientation where the pump laser is perpendicular to the magnetic field. It is assumed the relative distribution of atoms in F=2 state is given by spin-temperature distribution. The spin temperature distribution is realized when the rate of spin-exchange collisions is higher than other relaxation rates. It is also realized during optical pumping on a pressure broadened optical resonance with fast J-damping in the excited state. These conditions are reasonably well-satisfied in the disclosed experiment. In a 50 µT Earth's field, the maximum size of the correction given by Eq. 4 is on the order of 15 nT with full polarization (P=1).

FIG. 1 shows the comparison between heading error correction calculated with Eq. 4 and numerical simulation of the density matrix evolution. The density matrix model includes optical pumping, free spin precession evolution, and signal fitting as done in the experiment. They agree well in high polarization limit. Thus, if the initial polarization is experimentally found and the angle is extracted, Eq. 4 can be used to find the heading-error free magnetic field. At low polarization more complex behavior is expected due to the incomplete depopulation of F=1 state.

A Pulsed-Pump Double-Probe Rb-87 Magnetometer

Figure 2A:
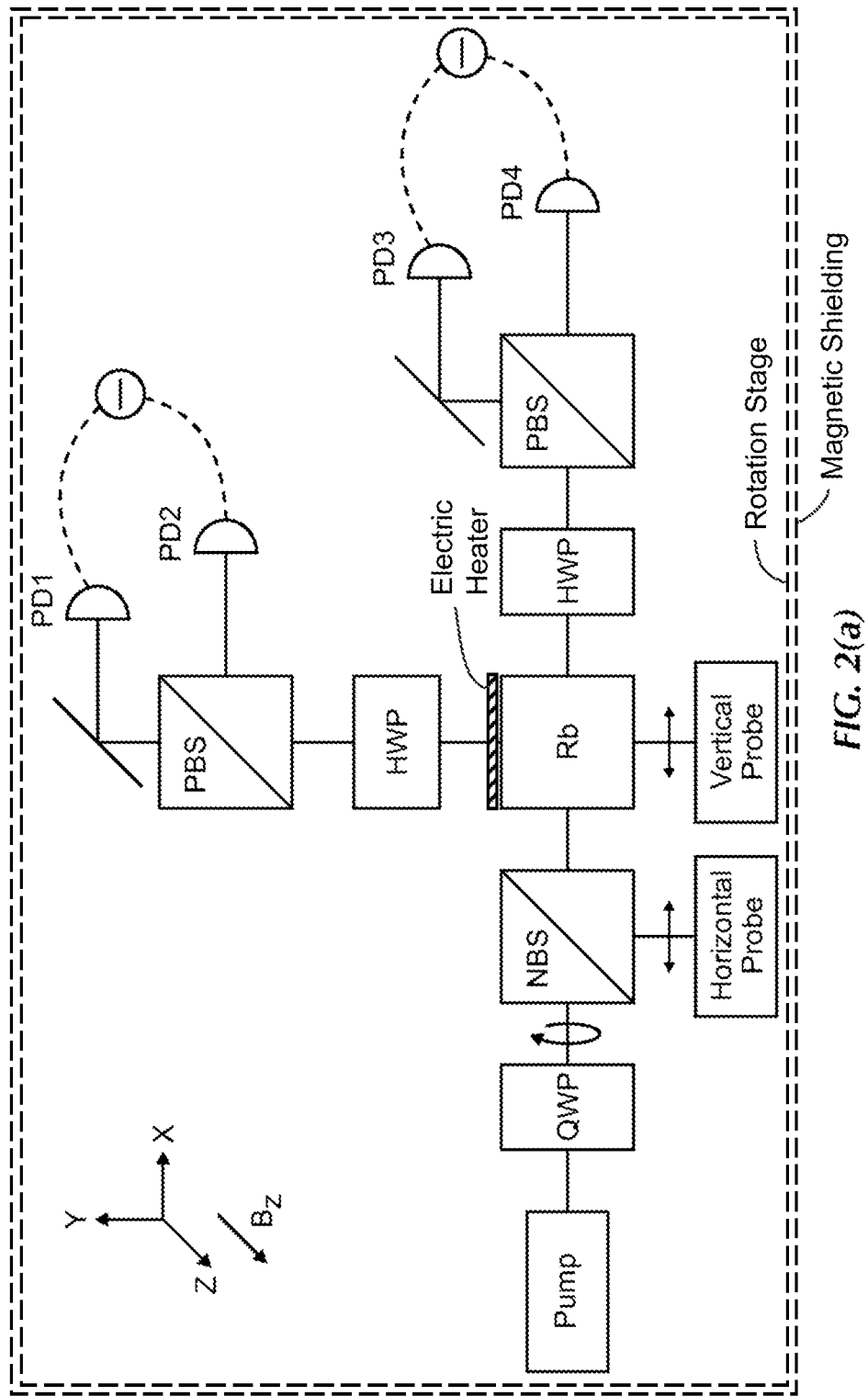
FIG. 2(a) depicts a schematic of an integrated Rb-87 magnetometer according to an embodiment of the present invention.

A compact integrated magnetometer is used for embodiments disclosed herein with schematic shown in FIG. 2(a). It includes a Rb-87 vapor cell (Rb), electric heaters, a pump laser, two probe lasers, and two polarimeters. The cell has height and width of 5 mm, and length of 10 mm. It contains internal mirrors that allows pump and probe beams to reflect back and forth many times inside the cell. The probe beams exit the cell after 11 passes. The sensor is placed inside a magnetic shielding on a rotation stage that allows rotation of the whole assembly relative to the magnetic field. The multipass cell is filled with enriched Rb-87 vapor and 700 Torr $N_2$ buffer gas. It is typically heated to 100° C. giving a Rb-87 number density of $4\times10^{12}/cm^3$ as estimated based on measured transverse spin relaxation rate.

Figure 2B:
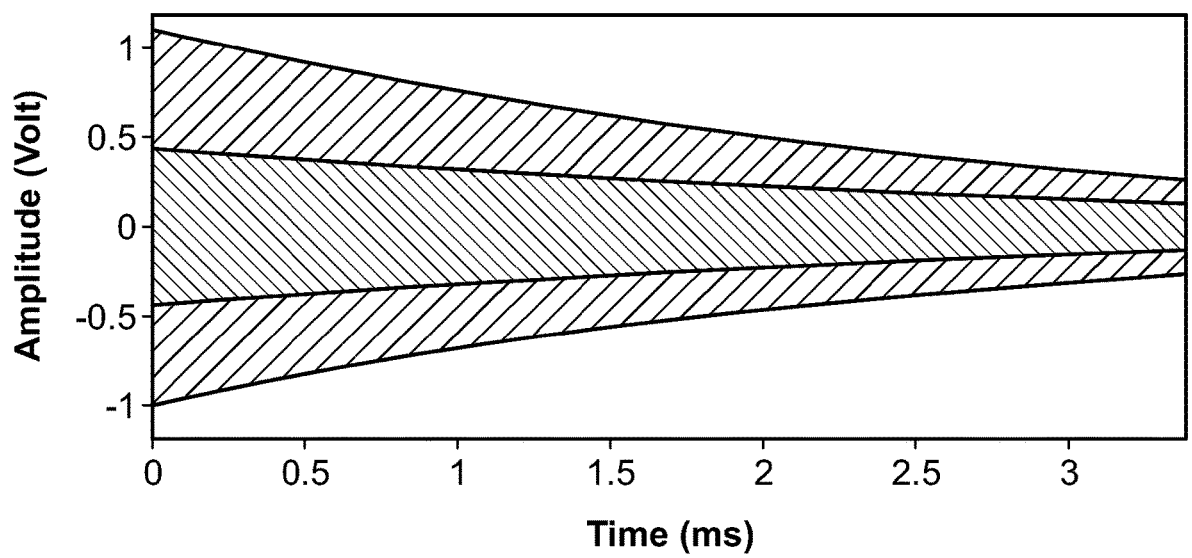
FIG. 2(b) depicts a graph of experimental rotation signals of horizontal probe and vertical probe acquired from a digital oscilloscope according to an embodiment of the present invention.

The pump laser is directed in x direction in FIG. 2(a), circularly polarized (e.g., using quarter-wave plate (QWP)) and tuned to the Rb-87 D1 line. It is operated in a pulsed mode with several watts instantaneous power. It has an adjustable repetition rate, number, and width of pulses. The usual pumping cycle includes 190 pulses with a 70 ns single pulse width that is much shorter than the Larmor period $\tau = 2\pi/\gamma B_z$. For a resonant build-up of the spin polarization, the pulse repetition rate is synchronous with the Larmor frequency. The magnetic field is created by a concentric set of cylindrical coils inside two layers of u-metal magnetic shields. The spin free precession is detected by two off-resonant vertical-cavity surface-emitting laser (VCSEL) probe beams which are linearly polarized. One laser propagates in the x direction, parallel to the pump laser ("horizontal probe") via a nonpolarizing beam splitter (NBS), and the other propagates in the y direction, orthogonal to the pump laser ("vertical probe"). Each balanced polarimeter includes a half-wave plate (HWP), a polarizing beam-splitter (PBS), and two photodiodes (PD1/PD2 and PD3/PD4) with differential amplification. The two differential signals $V_{ver} = V_1 - V_2$ and $V_{hor} = V_3 - V_4$ are recorded by a digital oscilloscope and have the general form of a sine wave with exponential decay plus an offset:

$$V(t) = V_0 \cos(2\pi\nu t + d)e^{-\frac{t}{T_2}} + V_{DC}(t) \quad (5)$$

where $V_0$ is the initial amplitude, $\nu$ is the precession frequency, d is the phase delay, $T_2$ is the transverse spin relaxation time, and $V_{DC}$ is the offset. FIG. 2(b) shows the experimentally measured signals at 50 µT. The vertical probe shows a smaller signal than the horizontal probe as it has a smaller interaction volume from a smaller overlap region with the pump beam. An external frequency counter (HP53310A) measures the frequency of the signal by detecting its zero-crossings during the free precession measurement time $T_m = 3$ ms, which is comparable to $T_2$. External high-pass filters are added with $f_c = 20$ kHz to cancel DC offsets in the signals going to the frequency counter. The frequency is continuously measured and the center frequency of its histogram distribution is read with a standard deviation of about 1 mHz.

Figure 3:
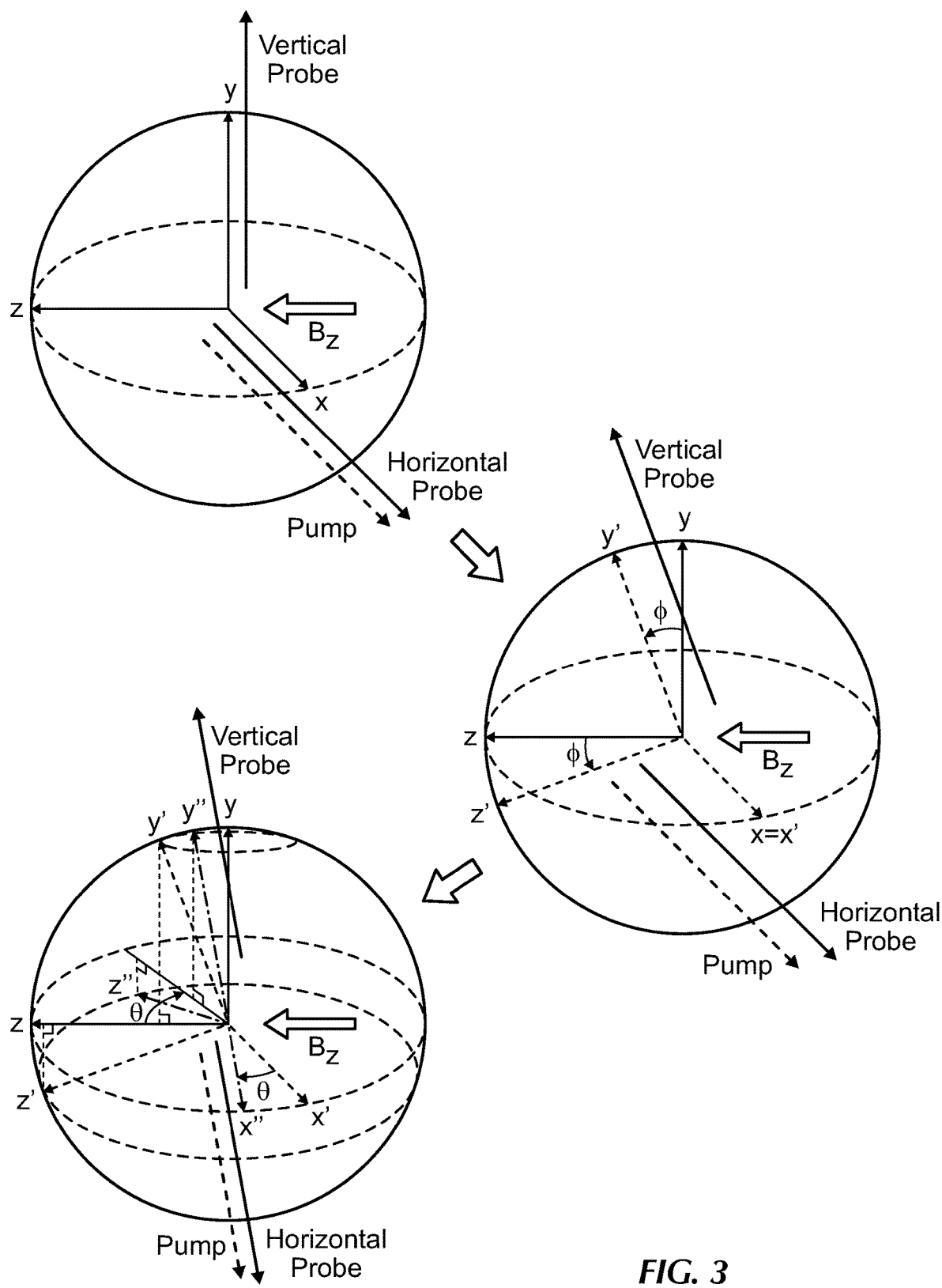
FIG. 3 depicts a pump-probe geometry of a Rb-87 magnetometer according to an embodiment of the present invention.

FIG. 3 describes the pump-probe geometry after a change in sensor orientation. The horizontal probe is always collinear to the pump, and the vertical probe is always orthogonal to the pump. In the initial configuration ($\theta = 0°$), the pump and horizontal probe are in x, and the vertical probe is in y. After a sensor rotation, the pump beam and horizontal probe are in x" direction and tilted by $\theta$ from the initial magnetometer orientation x where the field $B_z$ is perpendicular to the spin. The vertical probe is in y' direction at a small angle $\phi = 11°$ from y. This is due to the small tilt of the sensor assembly relative to the vertical axis of the rotation stage that supports the sensor. With the tilt of the sensor, the rotation matrix transforming x, y, z to x", y", z" coordinates is:

$$R = \begin{pmatrix} \cos\theta & 0 & -\sin\theta \\ 0 & 1 & 0 \\ \sin\theta & 0 & \cos\theta \end{pmatrix}\begin{pmatrix} 1 & 0 & 0 \\ 0 & \cos\phi & \sin\phi \\ 0 & \sin\phi & \cos\phi \end{pmatrix} = \begin{pmatrix} \cos\theta & -\sin\theta\sin\phi & -\sin\theta\cos\phi \\ 0 & \cos\phi & -\sin\phi \\ \sin\theta & \cos\theta\sin\phi & \cos\theta\cos\phi \end{pmatrix} \quad (6)$$

In the final configuration, the pump and the horizontal probe are therefore in $\hat{x}''=\cos\theta\hat{x}+\sin\theta\hat{z}$, and the vertical probe is in $\hat{y}''=-\sin\theta\sin\emptyset\hat{z}+\cos\emptyset\hat{y}+\cos\theta\sin\emptyset\hat{z}$.

Measurement of Heading Errors

Figure 4A:
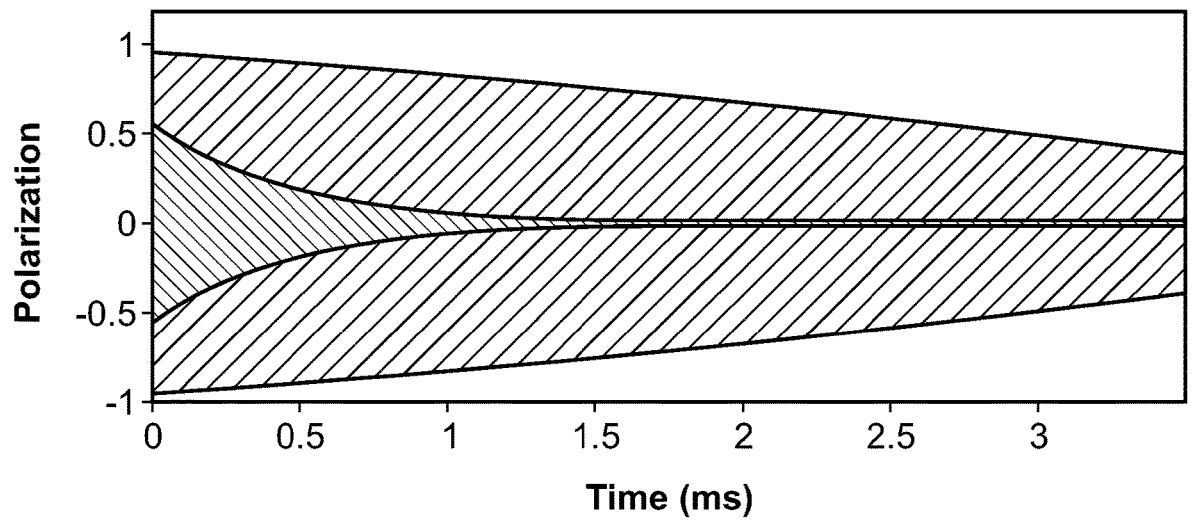
FIG. 4(a) depicts a graph of simulated decay according to an embodiment of the present invention.

The pulsed pump laser can achieve very high initial spin polarization near 95%. This minimizes the polarization-dependent heading errors. In FIG. 4(a) the simulated signals for each hyperfine state are plotted separately, showing how much each hyperfine state contributes to $\langle S_x\rangle$ for initial atomic spin polarization P=0.95. The F=1 signal has a very small initial amplitude compared to the F=2 signal and decays faster during the precession. To maximize the polarization experimentally, the width and number of pump pulses are adjusted until the signal amplitude at t=0 in FIG. 4(a) saturates.

Figure 4B:
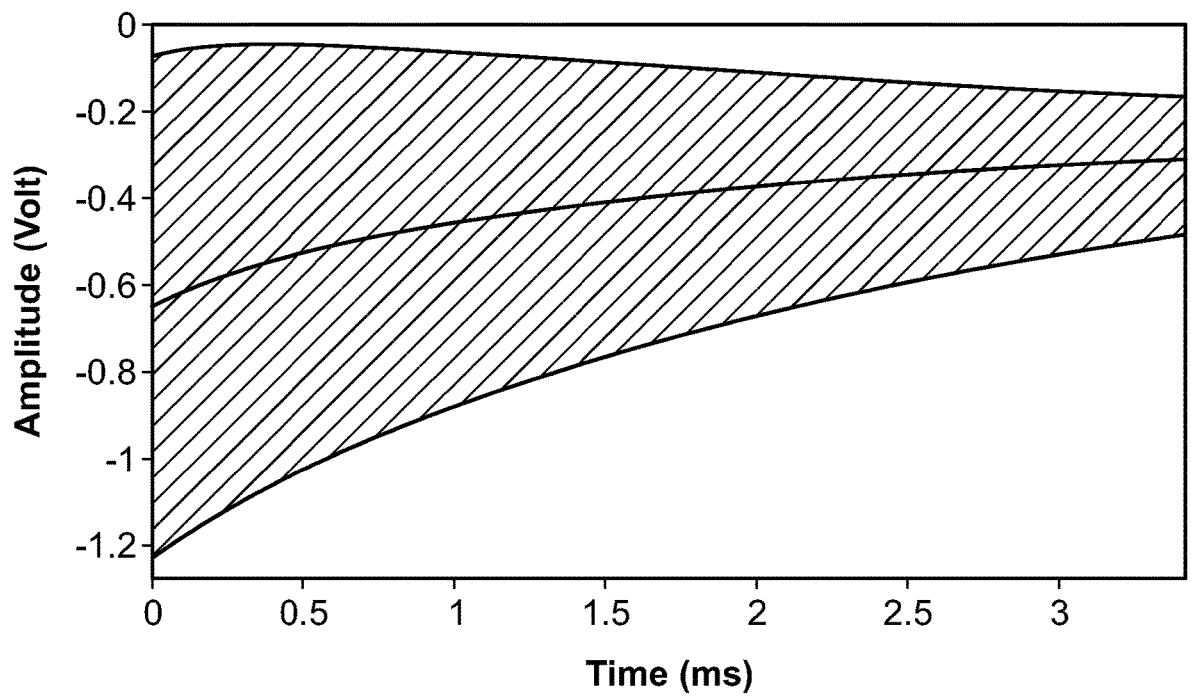
FIG. 4(b) depicts a graph of measured spin precession by the horizontal probe according to an embodiment of the present invention.
Figure 4C:
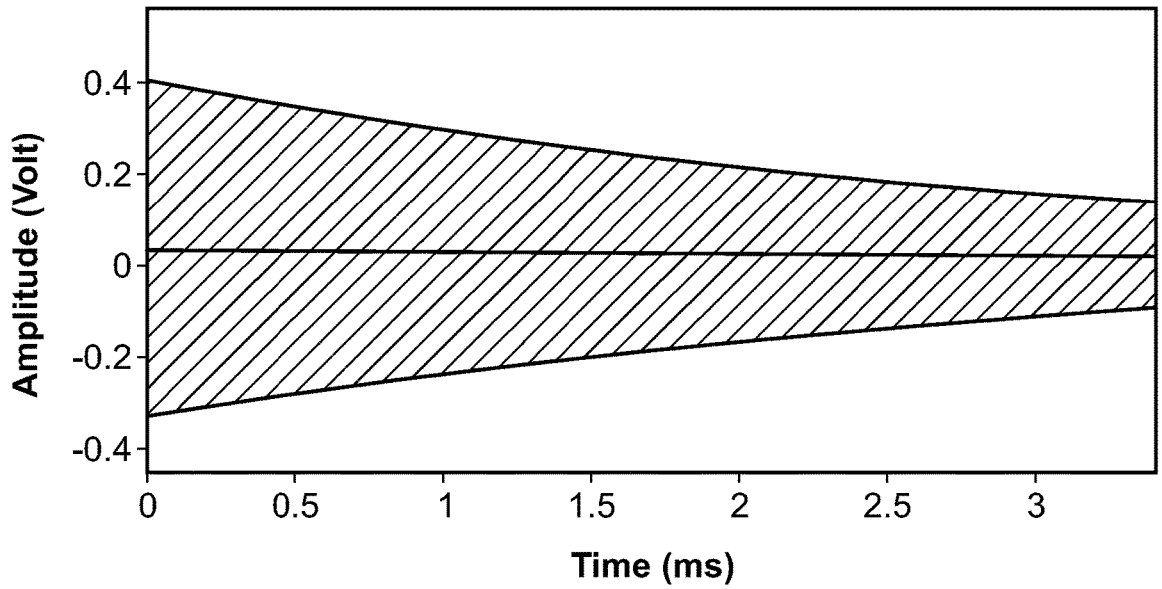
FIG. 4(c) depicts a graph of measured spin precession by the vertical probe according to an embodiment of the present invention.

In order to apply Eq. 4 to correct for the heading error one must know the tilt angle $\theta$ of the magnetometer as shown in FIG. 3. In the absence of other information about the field direction one can find the angle $\theta$ from the signal itself by considering the DC component of the spin precession signal. FIGS. 4(b) and 4(c) show the measured signals at $\theta=45°$ which have nonzero time-varying DC offsets compared to FIG. 2. A digital low-pass filter is applied to the measured signal to extract the DC component. The DC offset measures the spin component parallel to the magnetic field. As shown in FIG. 3, the sensor has a small tilt about x by $\phi$ such that the vertical probe is not perfectly transverse to the field $B_z$. As a result, the vertical probe signal also gains a small DC offset.

From Eq. 6, the initial optically pumped spin is $\vec{S}=S\hat{x}''=S\cos\theta\hat{x}+S\sin\theta\hat{z}$. Ignoring the spin relaxation for simplicity, the precessing spin at angular velocity $\omega$ is then $\vec{S}=S\cos\theta\cos\omega t\hat{x}+S\cos\theta\sin\omega t\hat{y}+S\sin\theta\hat{z}$. The horizontal probe detects the spin component:

$$S_{x'}=\vec{S}\cdot\hat{x}''=S_{AC}+S_{DC}=S\cos^2\theta\cos\omega t+S\sin^2\theta. \quad (7)$$

The first term is the projection of $S_x$ component which oscillates. The second term is the projection of $S_z$ component, resulting in the DC offset. Therefore, the ratio of the initial DC offset to maximum AC amplitude is $$\frac{s_{DC}}{s_{AC}}=\tan^2\theta.$$

Figure 5A:
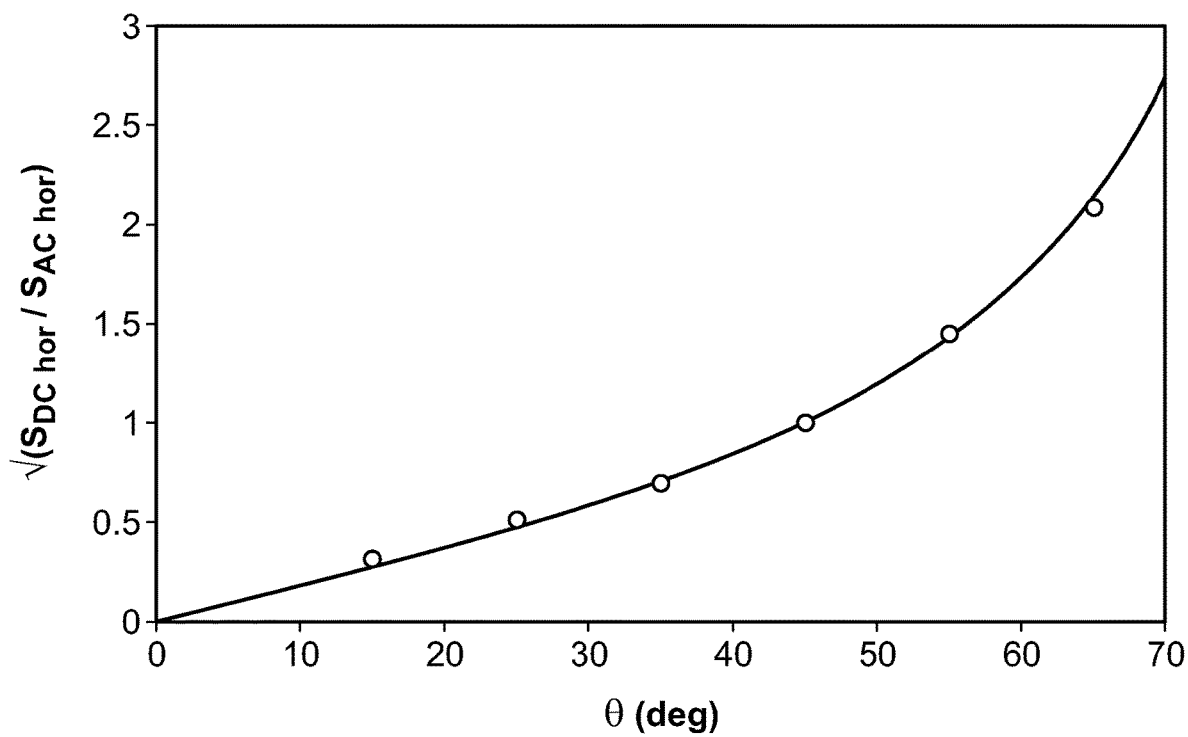
FIG. 5(a) depicts a measured initial ratio of DC offset to AC amplitude for the horizontal probe signal according to an embodiment of the present invention.

FIG. 5(a) shows good agreement between this equation and the measurements, allowing for estimating the magnitude of $\theta$.

The magnitude of $\phi$ can also be determined based on the vertical probe signal. The vertical probe detects the spin component:

$$S_{y'}=\vec{S}\cdot\hat{y}''=S_{AC}+S_{DC}=S\cos\theta(\cos\emptyset\sin\omega t-\sin\theta\sin\emptyset\cos\omega t)+S\sin\theta\cos\theta\sin\emptyset. \quad (8)$$

The ratio of the initial DC offset to maximum AC amplitude is then $$\frac{s_{DC}}{s_{AC}}=\sin\theta\sin\phi\Big/\sqrt{1-\cos^2\theta\sin^2\phi}.$$

Figure 5B:
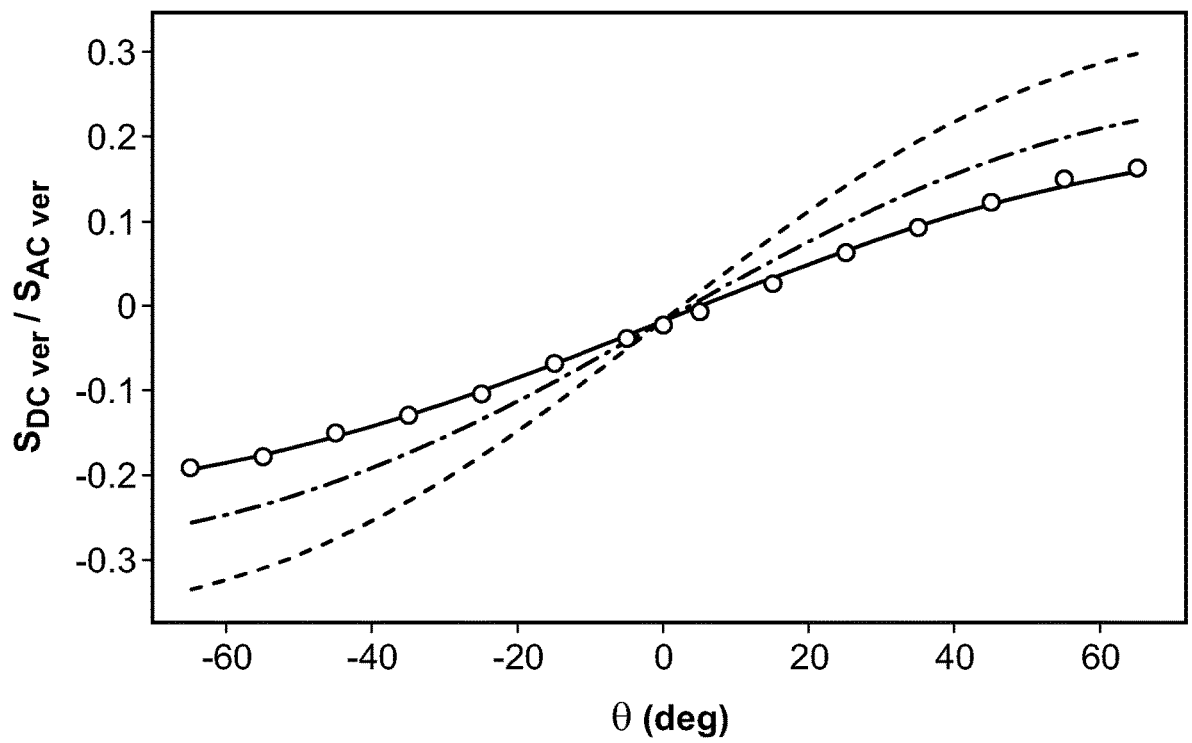
FIG. 5(b) depicts a measured initial ratio of DC offset to AC amplitude for the vertical probe signal according to an embodiment of the present invention.

FIG. 5(b) shows the measurement of the $$\frac{s_{DC}}{s_{AC}}.$$

ratio of the vertical probe signal, which gives an estimation of $\phi=11.2°$. The sign of $\theta$ and $\phi$ cannot be found independently since they are coupled as shown in the expression of $$\frac{s_{DC}}{s_{AC}}$$

The ratio of DC to AC signals can also be used to convert the scalar magnetometer to a vector sensor. This involves the additional modulation of the probe laser to determine the sign of $\theta$.

To measure the heading errors, the sensor is tilted with respect to the field in the range $-65°<\theta<65°$ and measure the spin precession frequency with the frequency counter. It is important to separate heading errors due to spin interactions from heading errors associated with remnant magnetization of magnetometer components. Rotation of the sensor relative to the field changes the projection of the remnant magnetic fields onto the leading field, resulting in frequency shifts that are hard to distinguish from atomic heading errors. The sensor was constructed with a minimal number of magnetic components. However, there are small amounts of polarizable ferrous materials present in the laser mounts and other electronic components. These components are degaussed, and heater electric currents are turned off during the measurement. Nevertheless, small offsets on the order of a few nT due to remnant magnetization of the sensor remained. To account for these offsets, the polarization of the pump laser was periodically reversed with a half-wave plate and measurements were taken with both polarizations. This approach is used to cancel heading errors by averaging the signals from the two pump polarizations. In this case the difference of the signals are taken to separate the heading errors due to the spin interaction and those due to magnetization of the components in the sensor head.

Heading Errors as a Function of the Sensor Orientation

Figure 6A:
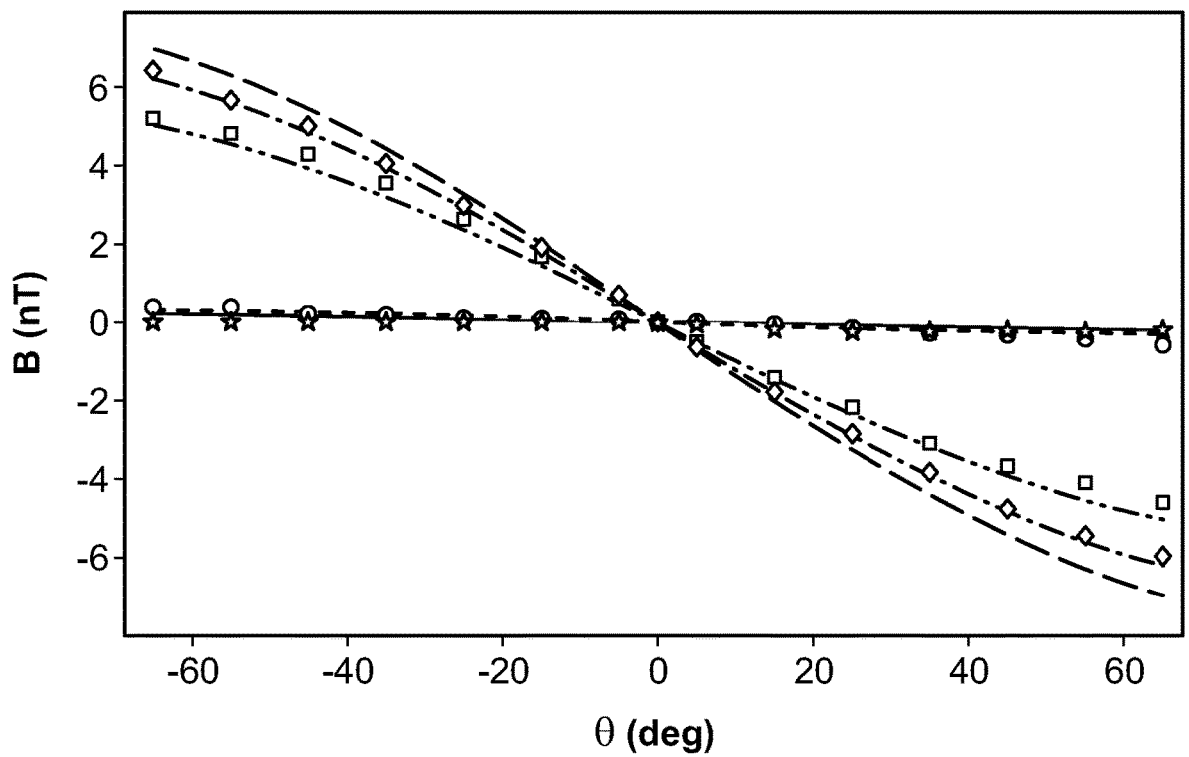
FIGS. 6(a)-(b) depict a graph of measurement of heading errors according to an embodiment of the present invention.
Figure 6B:
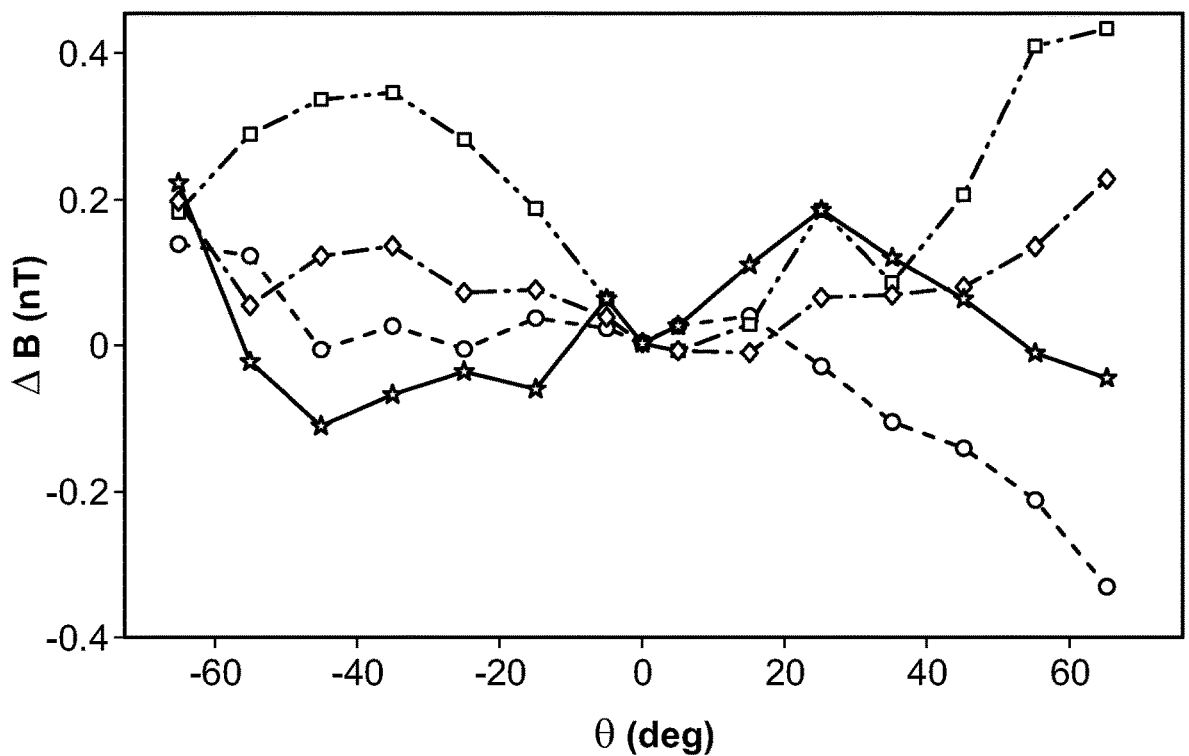

FIGS. 6(a)-(b) report the measurement of heading errors in 10 μT and 50 μT fields as a function of the sensor's tilt angle $\theta$. If a difference is taken between the two measurements at opposite pump polarizations, the field values at $\theta=0$ are canceled to the order of 0.01 nT. The angle $\theta$ is determined from spin precession signals with an uncertainty of about 1°. Fitting to Eq. 4 gives an estimation of the initial polarization, about P=0.9 for the parallel probe signal and P=0.7 for the vertical probe signal. As described previously, the vertical probe has a smaller overlap with the pump beam than the horizontal probe and measures optical rotation from atoms that are less polarized. In a 10 μT field, the heading errors are expected to be only 4% of those in 50 μT. FIG. 6(b) shows that the residual errors are comparable and in fact slightly smaller for the case of B=50 μT. This indicates that the residuals are likely due to imperfection in the cancellation of remnant magnetization of sensor components. Even so, it is shown that the amplitude of heading errors due to atomic physics effects are reduced by about a factor of 50 for the horizontal probe measurement and a factor of 20 for the vertical probe measurement by the correction given by Eq. 4.

Figure 7A:
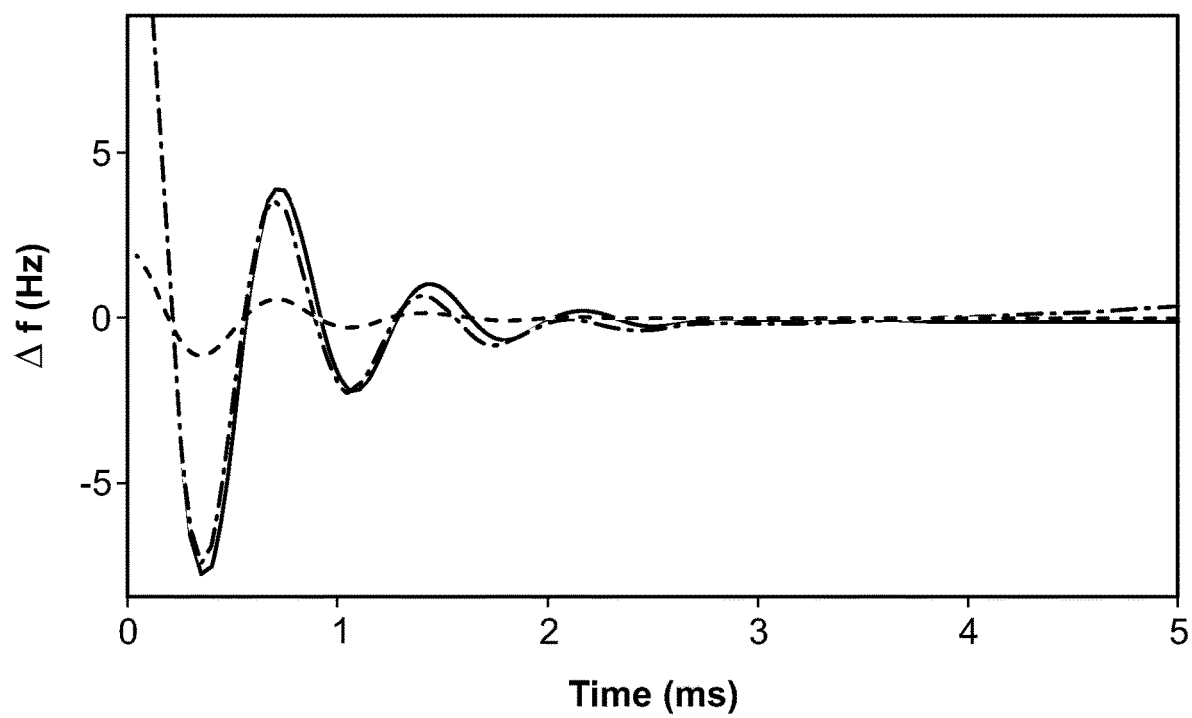
FIG. 7(a) depicts a graph of simulated time-evolution of precession frequency according to an embodiment of the present invention.

When the initial spin polarization is less than unity, there is some contribution from F=1 state. This manifests itself as an oscillation in the instantaneous spin precession frequency as illustrated in FIG. 7(a). The simulated spin precession signals are fit to Eq. 5 in individual time segments of 0.05 ms to show the time dependence of the spin precession frequency. It is found that it oscillates at 1.4 kHz, which is equal to the difference between Zeeman frequencies for F=1 and F=2 states at 50 μT. It is confirmed that at other magnetic fields the beating frequency is proportional to the magnetic field. As expected, the amplitude of the oscillations becomes larger for smaller spin polarization. The decay rate of the oscillations depends on the $T_2$ of the F=1 coherences. This beating effect is not sensitive to the orientation of the sensor, so the oscillations at θ=0 and θ=45° are similar. However, for θ=45° one can observe a small additional slow drift of the spin precession frequency. This drift is due to differences in the relaxation rate of F=2 coherences, as discussed in more detail in the next section.

Figure 7B:
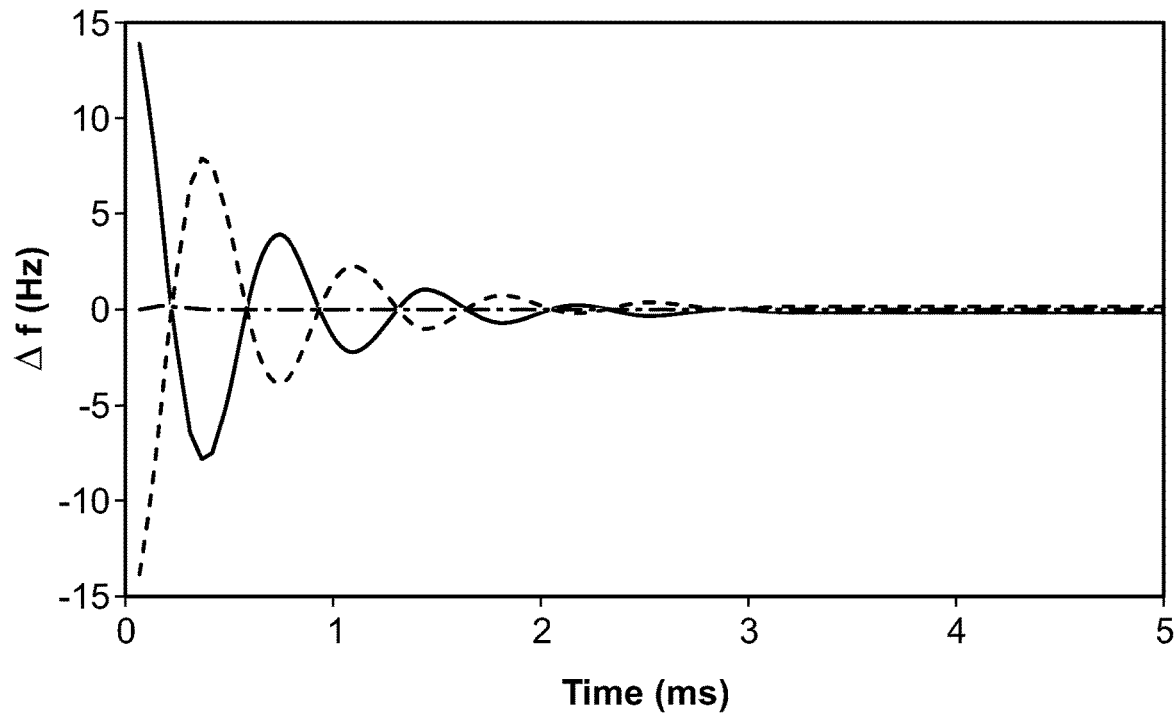
FIGS. 7(b)-(c) depict a graph of simulated time-evolution of precession frequency according to an embodiment of the present invention.
Figure 7C:
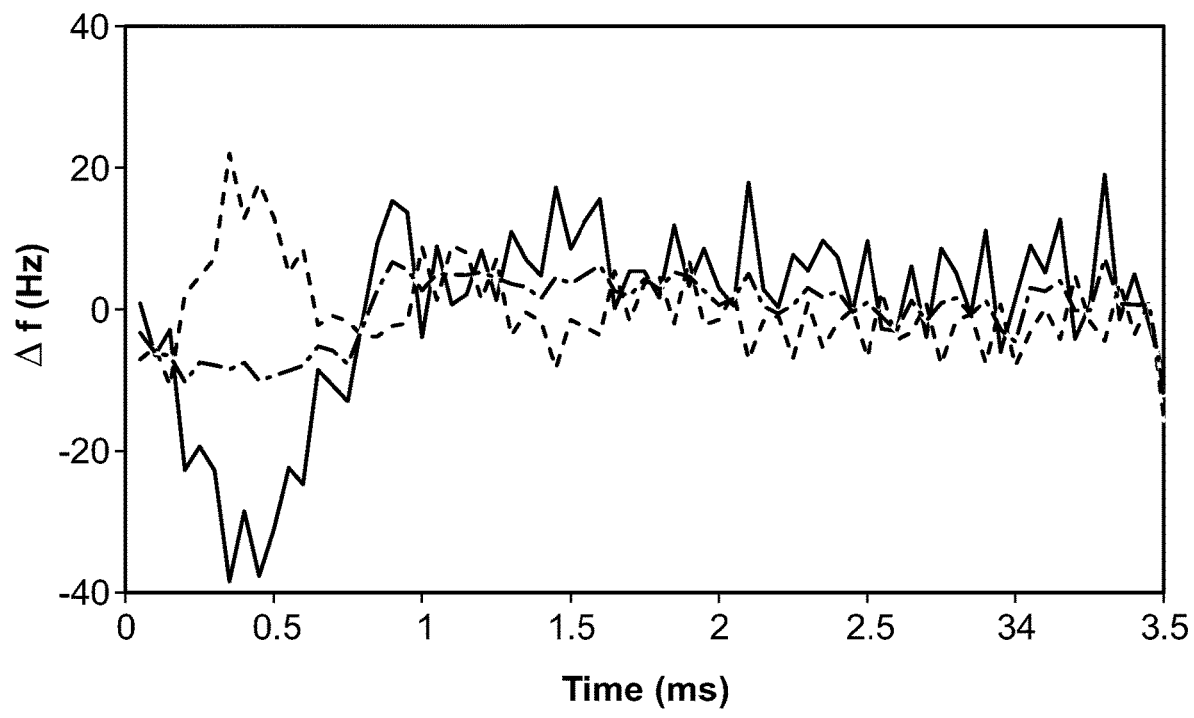

It is found that the oscillations in the instantaneous spin precession frequency have opposite sign for the horizontal and vertical probe beams, as illustrated in FIGS. 7(b)-(c). As the two hyperfine states have opposite spin precession directions, the horizontal probe detects maximum signal when $\langle S_x \rangle_{F=2}$ and $\langle S_x \rangle_{F=1}$ are out of phase while the vertical probe detects maximum signal when they are in phase. Therefore, the frequency oscillation can be canceled by averaging the two probe measurements, which reduces the amplitude of frequency oscillations by more than two orders of magnitude. This was experimentally verified as shown in FIG. 7(c), which is based on fitting the experimental signal to Eq. 5. The two probe measurements show opposite sign of frequency oscillation. The oscillations are larger for the vertical probe beam because it detects a lower average spin polarization. The amplitudes of the experimentally observed oscillations in the instantaneous spin precession frequency appear larger than those predicted by the simulation. This could be due to spatial non-uniformity of the polarization in the cell which is not considered in the simulation.

Heading Errors as a Function of the Absolute Magnetic Field

Figure 8:
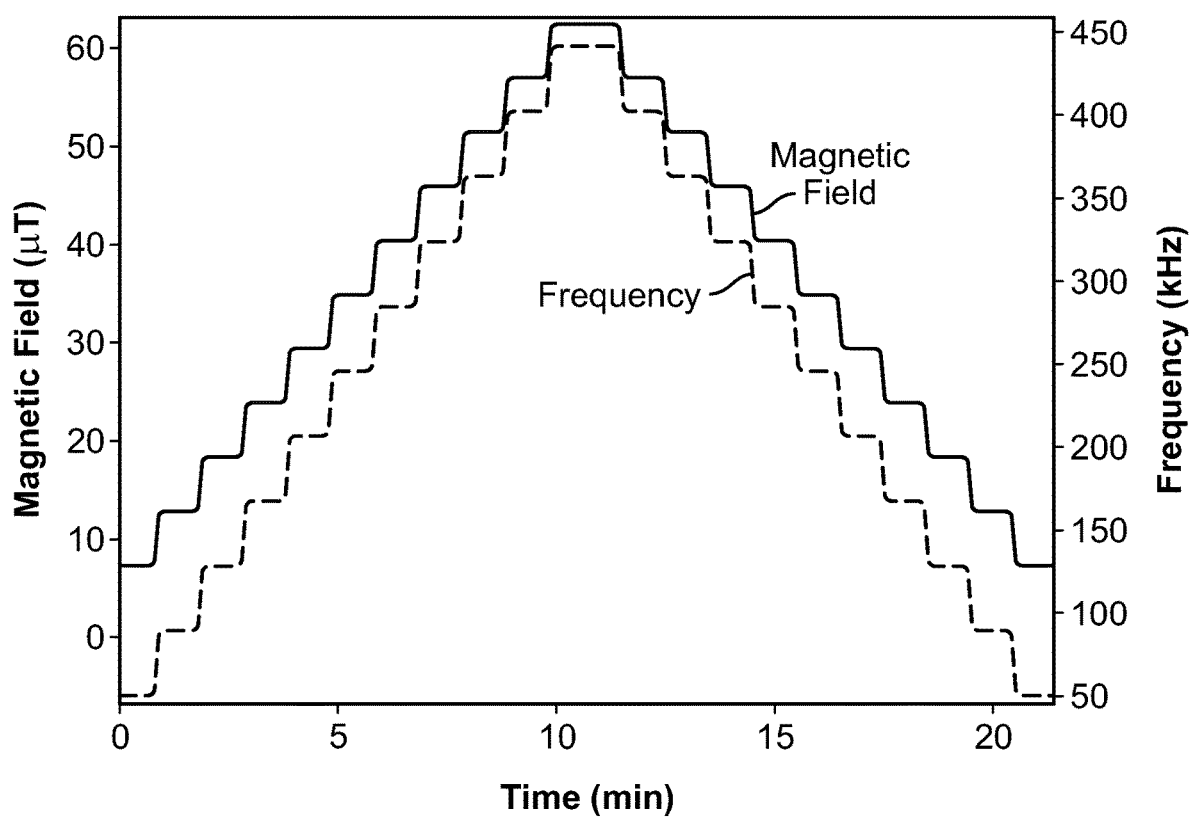
FIG. 8 depicts a graph of systematic modulation of magnetic field and simultaneous measurement of precession frequency according to an embodiment of the present invention.

In addition to investigating heading errors as a function of the angular orientation of the sensor, heading errors are also examined as a function of the absolute magnetic field. The spin precession frequencies are measured as a function of magnetic fields at high (P=0.85) and low (P=0.2) polarizations with the vertical probe. For these measurements it is necessary to create a well-controlled linear magnetic field ramp. The measurements are performed inside magnetic shields which generate a significant hysteresis of the magnetic field. To create a reproducible magnetic field a staircase ramp is applied as illustrated in FIG. 8. The magnetic field scan is repeated several times without interruptions. The current through the magnetic field coil is monitored using a precision shunt resistor while the repetition rate of the optical pumping pulses is continuously adjusted under computer control to match the Larmor frequency. After several up and down sweeps, both the field and frequency measurements are averaged during the same time period to suppress any field fluctuations.

Figure 9A:
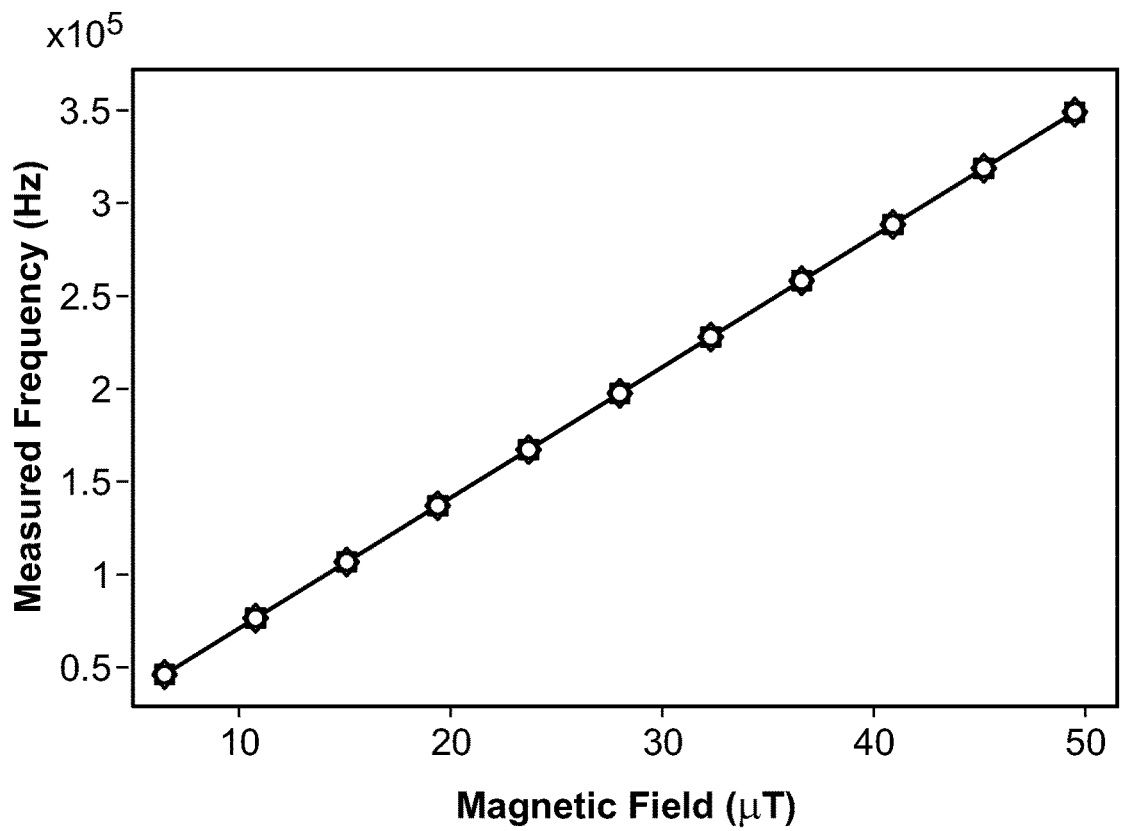
FIGS. 9(a)-(b) depict a graph of measurement of spin precession frequency as a function of fields according to an embodiment of the present invention.
Figure 9B:
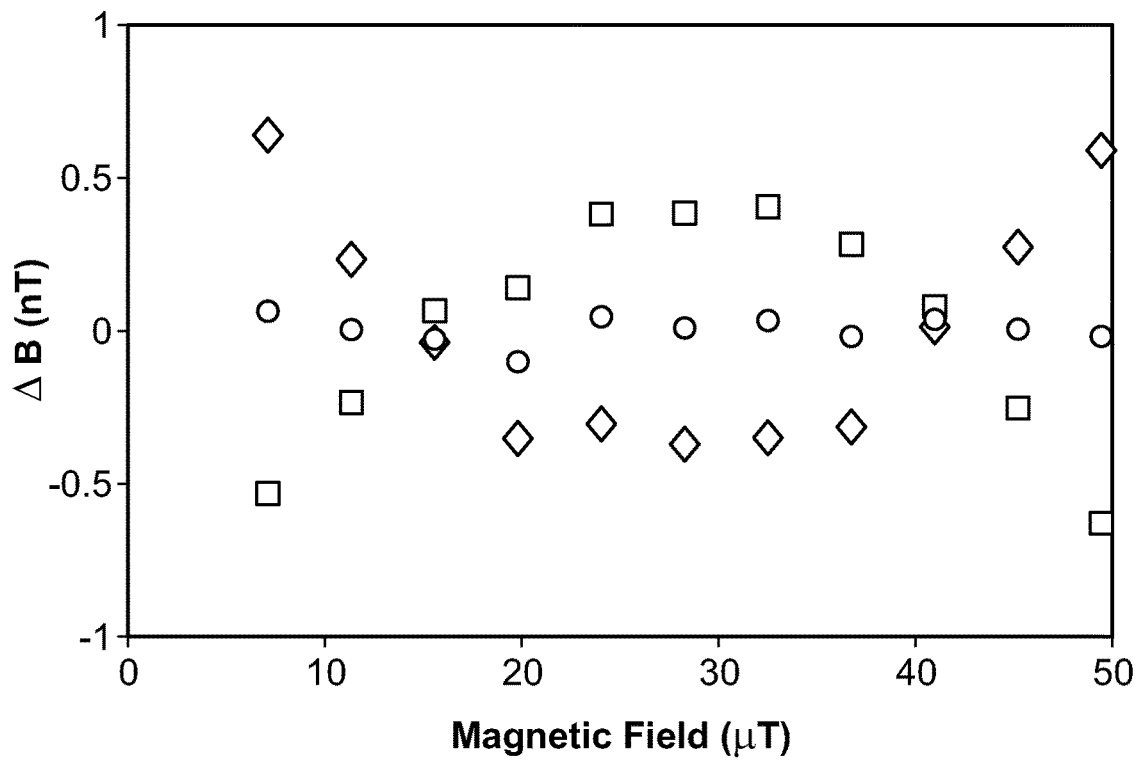

FIGS. 9(a)-(b) show the measured precession frequency as a function of fields with P=0.85 at θ=0°. With a quadratic fitting function, the frequency for upward and downward field sweeps show high curvature with opposite signs. This is due to the magnetic shield hysteresis, and averaging the two measurements reduces the curvature and residuals of linear fitting by two orders of magnitude.

Figure 10A:
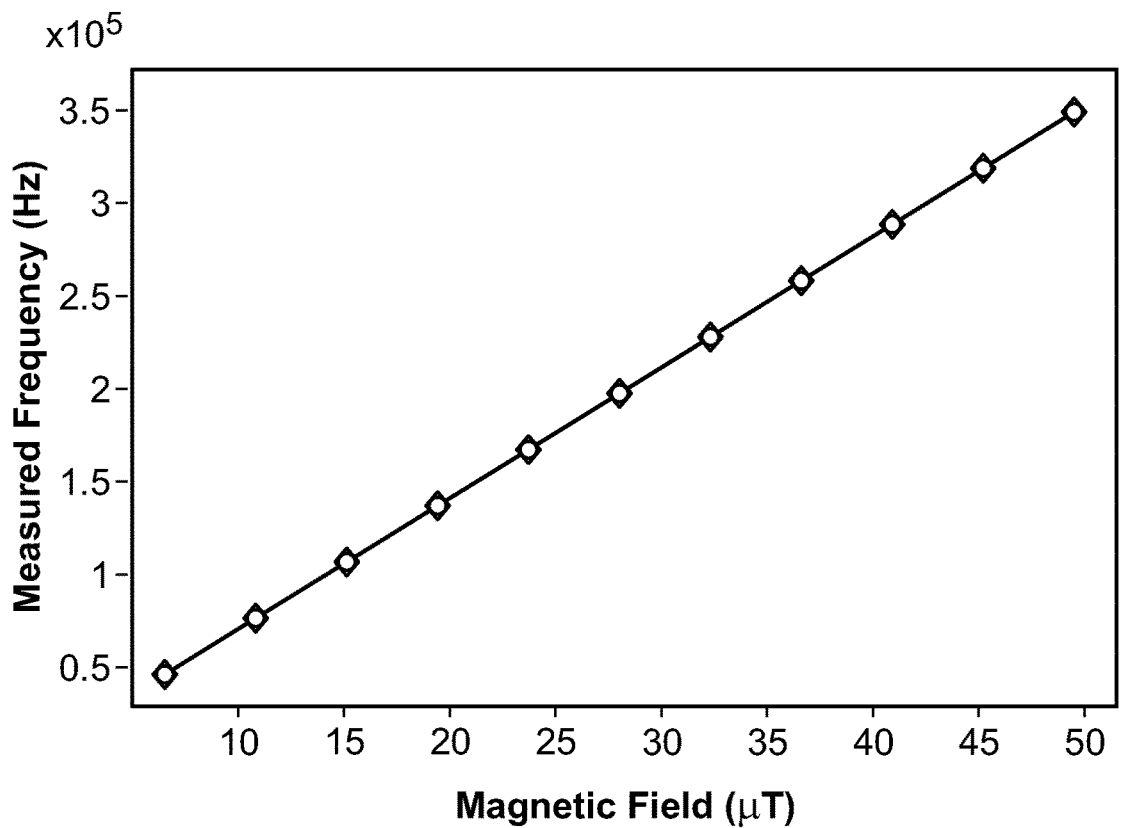
FIGS. 10(a)-(b) depict a graph of measurement of spin precession frequency as a function of fields according to an embodiment of the present invention.
Figure 10B:
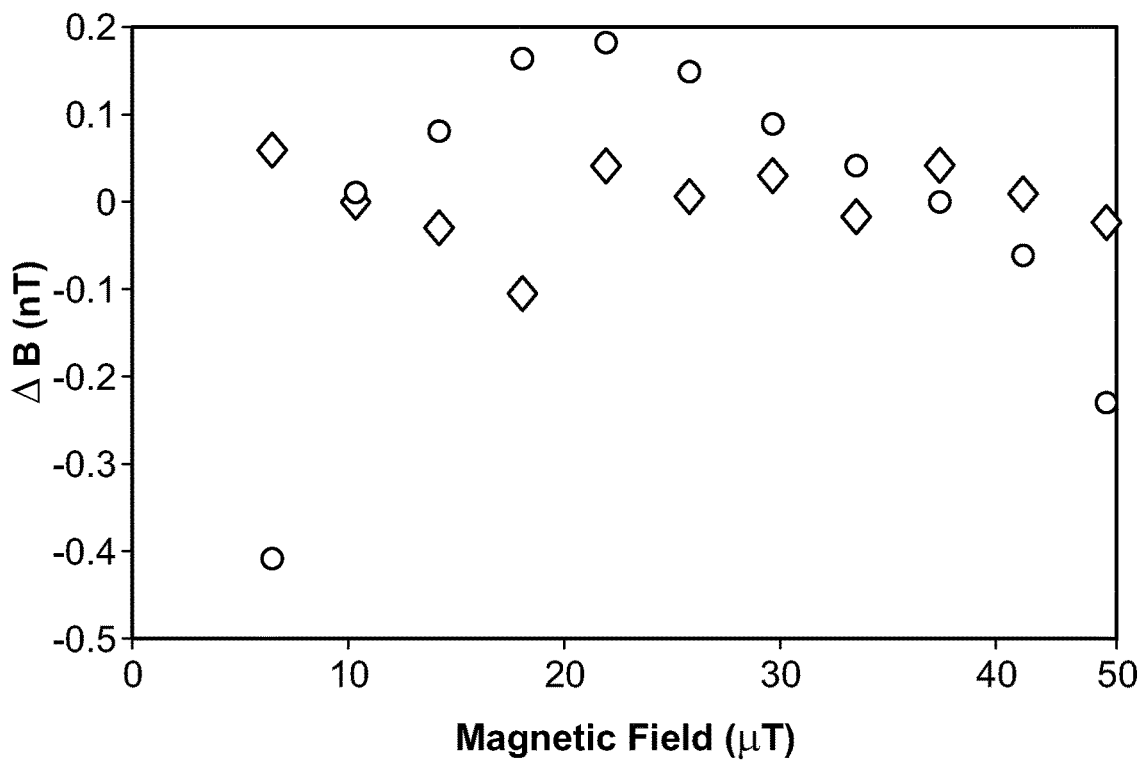

FIGS. 10(a)-(b) show results of averaging the upward and downward field sweep measurements at two different polarizations P=0.2 and 0.85. Even though the first order heading error correction at θ=0° is zero from Eq. 4, the low polarization result (P=0.2) shows a curvature of $-16\times10^{-4}$ Hz/μT$^2$, much higher than the curvature for high spin polarization (P=0.85) of $2\times10^{-4}$ Hz/μT$^2$.

Figure 11:
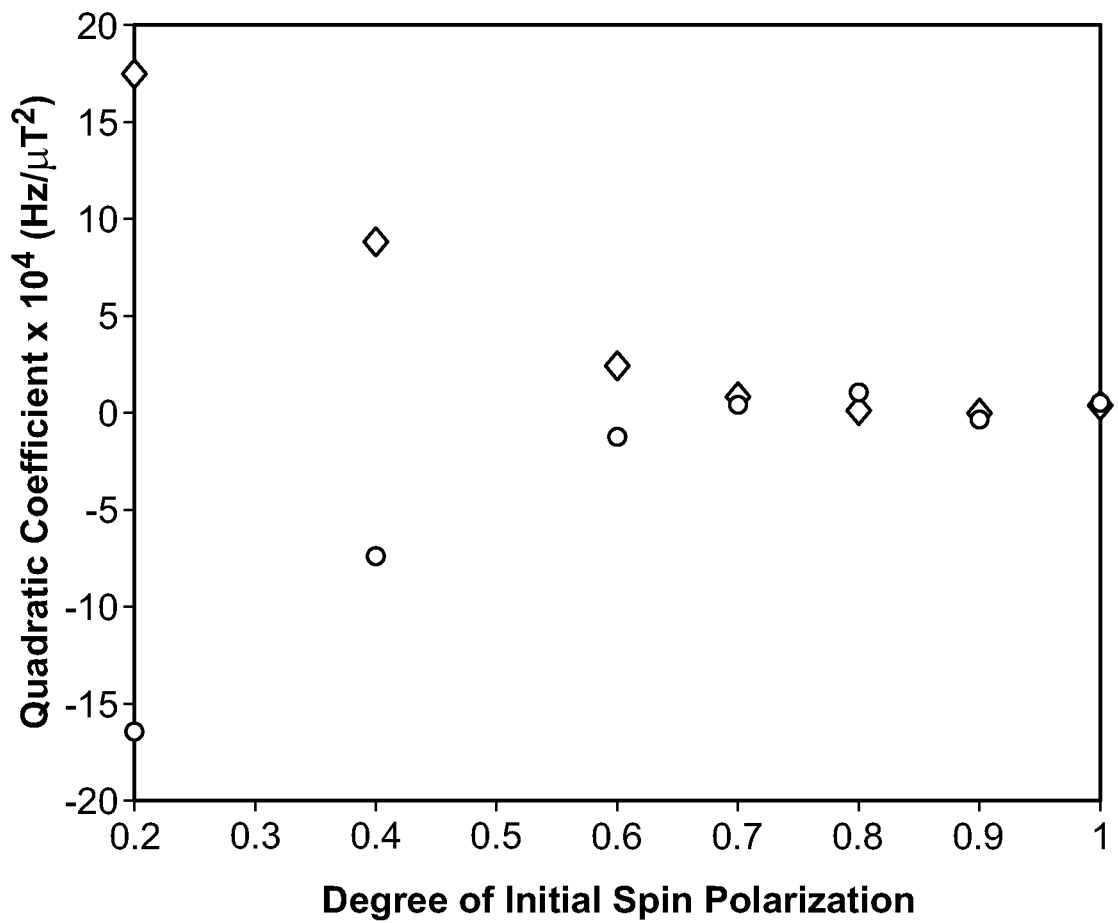
FIG. 11 depicts a graph of estimation of curvature of spin precession frequency as a function of fields according to an embodiment of the present invention.

FIG. 11 shows the simulated curvature as a function of polarization. The curvature is negligible in high polarization limit but starts to increase at P<0.7. The curvature C=16.52× $10^{-4}$ Hz/μT$^2$ at P=0.2 with the vertical probe agrees well with experimental measurement. This nonlinear frequency shift is due to the increase in population of F=1 state. The horizontal and vertical probe beams have opposite curvature signs. Therefore, averaging of the two signals can cancel the non-linearity of the frequency, similar to the cancellation of the instantaneous frequency oscillations described previously.

Figure 12A:
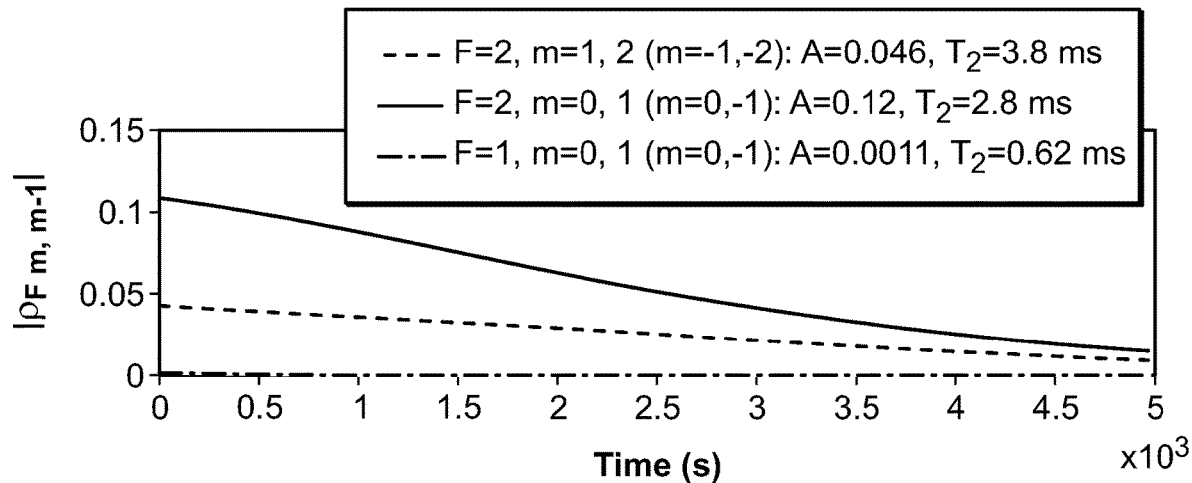
FIGS. 12(a)-(b) depict a graph of time-evolution of absolute values of simulated coherences according to an embodiment of the present invention.
Figure 12B:
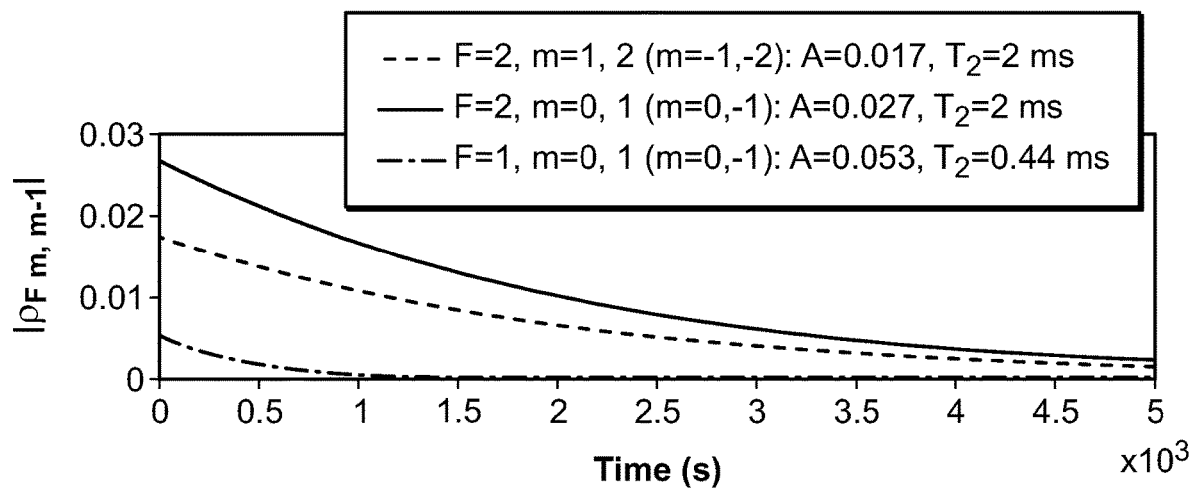

To understand the origin of the non-linearity the evolution of individual coherences is simulated. When θ=0° the F=2 state has two distinct coherences and F=1 state has one distinct coherence. Their initial amplitudes and relaxation are shown in FIGS. 12(a)-(b) for P=0.85 and P=0.2. The relative strength of F=1 coherence is much higher at P=0.2 than at P=0.85. As the nuclear spin causes splitting of Zeeman frequencies between two hyperfine states, their interference can generate the observed frequency shift at low polarization. To check the origin of the non-linearity, the nuclear magnetic moment is nulled in the simulation by setting $g_I$=0. The curvature at P=0.2 then reduced to C=0.2× $10^{-4}$ Hz/μT$^2$. This suggests that the nonlinear frequency shift at low polarization is caused by the linear Zeeman interaction of the nuclear magnetic moment.

CONCLUSION

Generally disclosed herein are embodiments for reducing heading errors in Rb-87 magnetometer as a function of both the direction and magnitude of magnetic field at different initial spin polarizations. The novel double-probe sensor has shown high sensitivity and significant heading error suppression.

In the high spin polarization limit, heading errors can be corrected for by using analytical expression which is derived based on the density matrix formalism. With the correction, the measured field accuracy is about 0.1 nT in a 50 μT Earth's field. The linearity of the measured Zeeman frequency is verified with respect to the field up to Earth's field with a deviation of less than 0.05 nT. At lower polarization, additional heading errors are observed due to the difference in Larmor frequency of the F=1 and F=2 states. This generates beating in the measured frequency, and it is no longer linear with the magnetic field. Numerical simulation shows that this nonlinearity is caused by the linear Zeeman interaction of the nuclear magnetic moment. To cancel these frequency shifts, measurements from two orthogonal probe beams that measure opposite relative phases between the two hyperfine coherences are averaged.

These results are useful in reducing systematics of alkali-metal-vapor atomic magnetometers operating at geomagnetic fields, especially those in navigation systems. Disclosed herein are approaches for cancelling heading errors with wide range of spin polarizations, and the pump-probe geometry presented herein can give a real-time correction of heading errors. Furthermore, the use of a small sensor and VCSEL lasers makes it suitable for development of compact and miniaturized sensors.

It is understood that the above-described embodiments are only illustrative of the application of the principles of the present invention. The present invention may be embodied in other specific forms without departing from its spirit or essential characteristics. All changes that come within the meaning and range of equivalency of the claims are to be embraced within their scope. Thus, while the present invention has been fully described above with particularity and detail in connection with what is presently deemed to be the most practical and preferred embodiment of the invention, it will be apparent to those of ordinary skill in the art that numerous modifications may be made without departing from the principles and concepts of the invention as set forth in the claims.

What is claimed is:

1. A method for reducing heading error in a magnetometer that uses Rb-87 atoms, the method comprising:
   exposing the magnetometer to a magnetic field;
   measuring a precession frequency and determining an angle θ that is an angular deviation of a pump laser beam from a nominal magnetometer orientation where the pump laser beam is perpendicular to the magnetic field; and
   determining heading error-free magnetic field based on $$B = \frac{4h\upsilon}{(g_s - 3g_I)\mu_B}\left[1 - \frac{3\upsilon}{\upsilon_{hf}}\sin\theta\frac{P(7+P^2)}{5+3P^2}\right]$$

wherein B is the magnetic field strength, $g_s$ and $g_I$ are the electronic and nuclear Landé factors, respectively, $\mu_B$ is the Bohr Magneton, $\upsilon=\omega/2\pi$ is the measured precession frequency, $\upsilon_{hf}$ is a hyperfine splitting frequency, and P is a degree of initial spin polarization.

2. The method of claim 1, further comprising determining an average Larmor frequency via an analytical expression that depends on an angle between the pump laser beam and the magnetic field.

3. The method of claim 1, further comprising measuring opposite relative phases between two hyperfine states during a spin precession via two orthogonal probe beams.

4. The method of claim 3, further comprising averaging the measured opposite relative phases to cancel frequency shifts.

5. The method of claim 1, further comprising using pulsed pumping via a pump laser to achieve higher initial spin polarization.

6. The method of claim 1, further comprising calculating heading error in real time.

7. The method of claim 1, further comprising:
   measuring an AC signal and a DC signal based on the vertical probe laser and/or horizontal probe laser; and
   determining the angle θ based on a ratio of the AC signal to the DC signal.

8. A magnetometer, comprising:
   a multipass cell containing Rb-87 vapor;
   a pump laser operated in a pulse mode that is synchronous with a Larmor frequency and oriented to pass a pump beam through the multi-pass cell in a first direction;
   a horizontal probe laser configured to pass a first probe beam through the multipass cell in a direction parallel to the pump beam; and
   a vertical probe laser configured to pass a second probe beam through the multipass cell in a direction perpendicular to the pump beam; and
   one or more processing units configured to:
      determine a direction of a magnetic field based on a ratio of an AC signal to an DC signal measured based on the vertical probe laser and/or horizontal probe laser; and
      determine heading error-free magnetic field based on $$B = \frac{4h\upsilon}{(g_s - 3g_I)\mu_B}\left[1 - \frac{3\upsilon}{\upsilon_{hf}}\sin\theta\frac{P(7+P^2)}{5+3P^2}\right]$$

wherein B is the magnetic field strength, $g_s$ and $g_I$ are the electronic and nuclear Landé factors, respectively, $\mu_B$ is the Bohr Magneton, $\upsilon=\omega/2\pi$ is a measured precession frequency, $\upsilon_{hf}$ is a hyperfine splitting frequency, P is a degree of initial spin polarization, and θ is an angular deviation of the pump beam from a nominal magnetometer orientation where the pump beam is perpendicular to the magnetic field.

9. The magnetometer of claim 8, wherein the multipass cell further contains a buffer gas.

10. The magnetometer of claim 8, wherein the multipass cell further comprises internal mirrors.

11. The magnetometer of claim 10, further comprising two polarimeters, each disposed in an optical path of the first probe beam or the second probe beam after the multipass cell, wherein each polarimeter comprises a half-wave plate to receive the first probe beam or the second probe beam and direct it towards a polarizing beam-splitter, which directs the first probe beam or the second probe beam towards two photodiodes with differential amplification.

12. The magnetometer of claim 8, wherein one probe laser propagates parallel to the pump laser and the other probe laser propagates orthogonal to the pump laser.

13. The magnetometer of claim 8, wherein an angle between the pump laser and the magnetic field determines an average Larmor frequency via an analytical expression.

14. The magnetometer of claim 8, wherein the two probe lasers are configured to measure opposite relative phases between two hyperfine states during a spin precession for a lower polarization.

15. The magnetometer of claim 14, wherein opposite relative phases are averaged to cancel frequency shifts.

16. The magnetometer of claim 8, wherein heading error is calculated in real time.

17. The magnetometer of claim 8, further comprising an electric heater to heat the Rb-87 vapor.

* * * * *